United States Patent
Annapragada et al.

(10) Patent No.: US 6,828,250 B1
(45) Date of Patent: Dec. 7, 2004

(54) PROCESS FOR ETCHING VIAS IN ORGANOSILICATE GLASS MATERIALS WITHOUT CAUSING RIE LAG

(75) Inventors: Rao Annapragada, Union City, CA (US); William F. Bosch, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 142 days.

(21) Appl. No.: 09/688,021

(22) Filed: Oct. 13, 2000

(51) Int. Cl.$^7$ ........................................... H01L 21/3065
(52) U.S. Cl. ............... 438/723; 438/710; 438/712; 438/723; 438/720; 438/725
(58) Field of Search .................... 438/710, 712, 438/723, 720, 725

(56) References Cited

U.S. PATENT DOCUMENTS

| | | | |
|---|---|---|---|
| 4,161,743 A | * | 7/1979 | Yonezawa et al. ............. 357/4 |
| 5,362,663 A | * | 11/1994 | Bronner et al. ............... 437/52 |
| 5,739,579 A | * | 4/1998 | Chiang et al. ............... 257/635 |
| 5,942,446 A | * | 8/1999 | Chen et al. ................ 438/734 |
| 6,074,959 A | * | 6/2000 | Wang et al. ................ 438/738 |
| 6,174,451 B1 | * | 1/2001 | Hung et al. ................ 438/723 |
| 6,180,518 B1 | * | 1/2001 | Layadi et al. ............... 438/639 |
| 6,211,092 B1 | * | 4/2001 | Tang et al. ................ 438/719 |
| 6,228,774 B1 | * | 5/2001 | Marquez ..................... 438/710 |
| 6,284,149 B1 | * | 9/2001 | Li et al. ....................... 216/64 |
| 6,380,096 B2 | * | 4/2002 | Hung et al. ................ 438/723 |
| 6,387,287 B1 | * | 5/2002 | Hung et al. ................... 216/67 |

OTHER PUBLICATIONS

Wolf et al., Silicon Processing for the VLSI Era vol. 1: Process Technology, Lattice Press, Sunset Beach, CA, USA, pp. 539–540, 546–558, 1986.*

* cited by examiner

*Primary Examiner*—Nadine G. Norton
*Assistant Examiner*—Matthew A. Anderson
(74) *Attorney, Agent, or Firm*—Beyer Weaver & Thomas LLP

(57) ABSTRACT

Process for etching features in wafers incorporating OSG dielectrics. The process results at once in minimal RIE lag, minimal bowing of the features formed by the etch process, good etch profiles, good resist selectivity, and good etch uniformity across the wafer. In order to provide these desirable results, a novel etch gas mixture, including CH2F2 and CF4 is employed. According to one embodiment of the present invention, this novel gas mixture is employed as part of a three-step etch process wherein the several etch steps have varying degrees of etch selectivity between wafer components. The methodology of the present invention is capable of implementation on a wide variety of existing semiconductor etch equipment.

12 Claims, 2 Drawing Sheets

PROCESS FOR ETCHING VIAS IN ORGANOSILICATE GLASS MATERIALS WITHOUT CAUSING RIE LAG

FIELD OF THE INVENTION

The present invention relates to semiconductor or integrated circuit manufacture. More particularly, the present invention relates the etching of features in integrated circuits. Still more particularly, the present invention relates to the manufacture of semiconductor devices including at least one layer of organosilicate glass dielectric have a feature formed therein by etching through the dielectric.

BACKGROUND OF THE INVENTION

Integrated circuits use dielectric layers, which have typically been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitance levels.

In general, the coupling capacitance in an integrated circuit is directly proportional to the dielectric constant, K, of the material used to form the dielectric layers. As noted above, the dielectric layers in conventional integrated circuits have traditionally been formed of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits. To date, a number of promising materials, which are sometimes referred to as "low-K materials", have been developed. Many of these new dielectrics are organic compounds.

One interesting class of organic low-K materials are compounds including organosilicate glass. By way of example, but not limitation such organosilicate dielectrics include CORAL™ from Novellus Systems, Inc. of San Jose, Calif.; Black Diamond™ from Applied Materials of Santa Clara, Calif.; and Sumika Film® available from Sumitomo Chemical America, Inc., Santa Clara, Calif.

During semiconductor wafer processing, features of the semiconductor device have been defined in the wafer using well-known patterning and etching processes. In these processes a photo resist material may be deposited on the wafer and may then be exposed to light filtered by a reticle. The reticle may be a glass plate that is patterned with exemplary feature geometries that block light from propagating through the reticle.

The development of an effective etching process for an organosilicate glass low-K film such as CORAL™ should take into account several criteria including etch rate, profile control, selectivity to underlying materials as well as critical dimension (CD) control. The etching of low-K dielectric materials was at first approached as if a silicon-based dielectric were being etched. This has not proven particularly effective, as with organic low-K films the chemistries and processes needed to effectively etch the material are substantially different than those for traditional silicon or silicon oxide etching. This has proven even more problematic for the etching of organosilicate glass low-K films.

Organosilicate glass low-K films are often etched using etchant gas flows of similar chemical composition to other materials used in the semiconductor manufacturing process. This can render the manufacture of such devices difficult. As integrated circuits geometries continue to shrink, plasma etch processes are required to define these high resolution patterns. The most widely used dry etch technique is Reactive Ion Etching, or RIE, which offers directionality and selectivity together with high throughput.

The etching of high aspect ratio trenches, sometimes referred to as HART, into OSG and other low-K materials is becoming increasingly important for micro- and nano-engineering. One example is in the case of comb-driven structures, trench capacitors, and trench isolation for vertical transistors. The aspect ratio, AR, is defined as the depth of the trench divided by its width. Currently, one of the most commonly implemented techniques for etching HART's is dry reactive ion etching, or RIE.

When etching HART's with RIE it is observed that the etch rate is dependant on time and the mask opening. In general, smaller trench openings are etched more slowly than those which are wider. Accordingly, large features etch at a faster rate than small features. This effect is known as RIE lag and apparently depends on the AR of the trench rather than on the depth or width of the trench.

Prior efforts at etching vias and other structures in wafers incorporating OSG have generally utilized some form of $Ar/C_4F_8/O_2$ etch chemistry. In general, these attempts have met with poor results. Many of these different processes resulted in either severe reverse RIE lag, poor via profiles, nonuniformity at high etch rates, or poor resist selectivity.

What is needed is a process chemistry for etching features in wafers incorporating OSG dielectrics which process results at once in minimal RIE lag, minimal bowing of the features formed by the etch process, good etch profiles, good resist selectivity, and good etch uniformity across the wafer.

It would be desirable if the methodology were capable of implementation on existing semiconductor etch equipment.

SUMMARY OF THE INVENTION

The present invention teaches a process chemistry for etching features in wafers incorporating OSG dielectrics which process results at once in minimal RIE lag, minimal bowing of the features formed by the etch process, good etch profiles, good resist selectivity, and good etch uniformity across the wafer. In order to provide these desirable results, a novel etch gas mixture, including CH2F2 and CF4 is employed. According to one embodiment of the present invention, this novel gas mixture is employed as part of a three-step etch process wherein the several etch steps have varying degrees of etch selectivity between wafer components.

The methodology of the present invention is capable of implementation on a wide variety of existing semiconductor etch equipment.

These and other advantages of the present invention will become apparent upon reading the following detailed descriptions and studying the various figures of the Drawing.

BRIEF DESCRIPTION OF THE DRAWING

For more complete understanding of the present invention, reference is made to the accompanying Drawing in the following Detailed Description of the Invention. In the drawing.

Figures 1A, 1B:
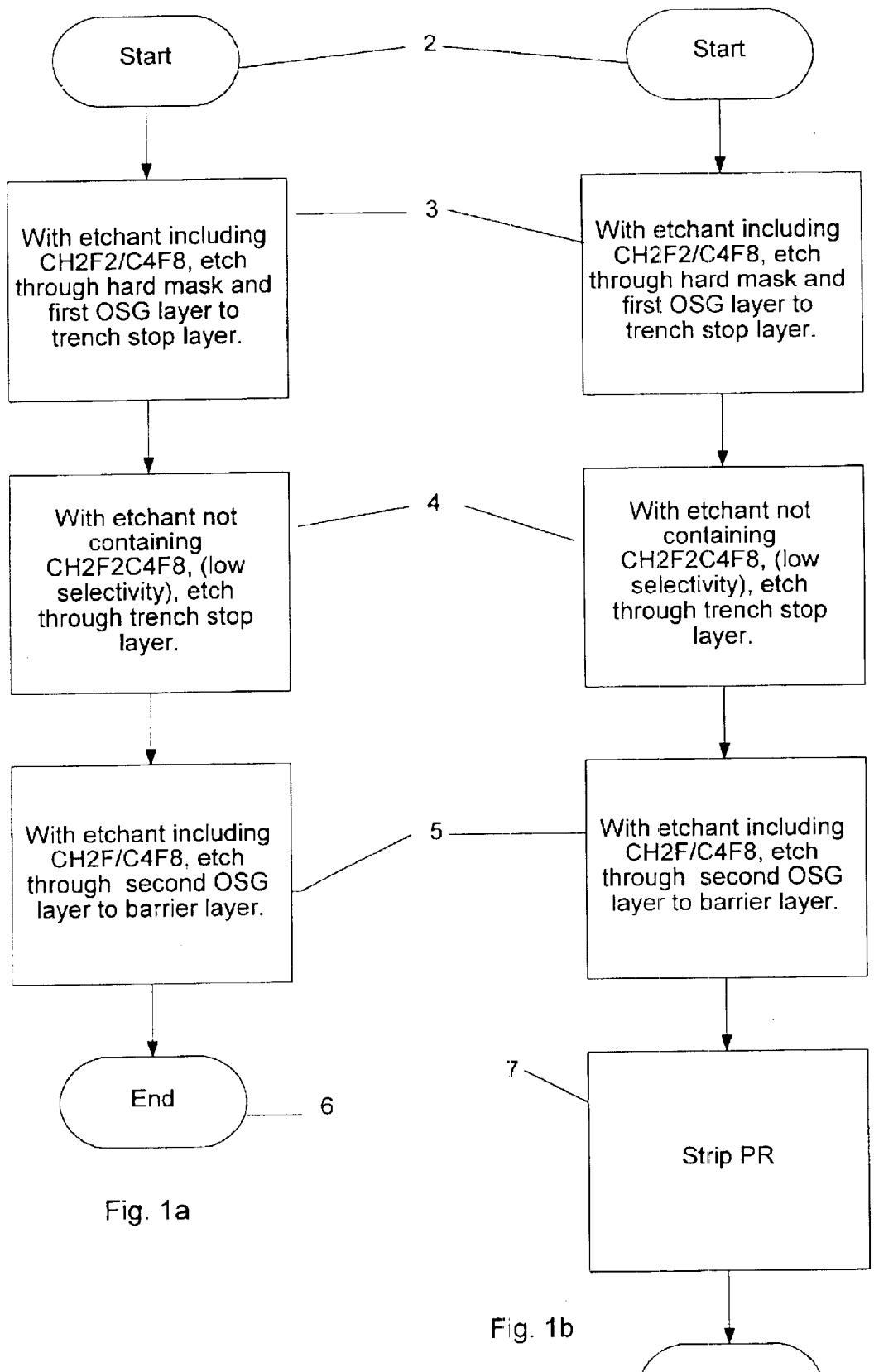
FIG. 1*a* is a flowchart representation of one embodiment of the present invention.
FIG. 1*b* is a flowchart representation of an alternate embodiment of the present invention, including an in site photoresist strip step.

Reference numbers refer to the same or equivalent parts of the invention throughout the several figures of the Drawing.

DETAILED DESCRIPTION OF THE PREFERRED EMBODIMENTS

The present invention teaches a novel etch chemistry for etching a wide variety of feature sizes and shapes in wafers incorporating blank dielectrics. The methodology taught herein results in minimal RIE lag, minimal bowing of the vias formed by the etch process, good etch profiles, good resist selectivity, and good etch uniformity across the wafer.

Prior efforts at etching vias in OSG have generally utilized some form of Ar/C4F8/O2 etch chemistry. In general, in these attempts have met with four results. Many of these different processes resulted in either severe reverse RIE lag, poor via profiles, nonuniformity at high etch rates, or poor resist selectivity.

In order to etch a variety of feature sizes, including but specifically not limited to trenches and vias, in wafers including organosilicate dielectric layers the present invention implements an etchant mixture including octafluorocyclobutane, C4F8 and tetraflouromethane, CF4. One embodiment of the present invention implements an etchant mixture including Ar, oxygen, difluoromethane, and octafluorocyclobutane.

Having reference to FIG. 1*a*, in order to practice the present invention a wafer is situated within a reaction vessel capable of forming and etch plasma. This reaction vessel or chamber may be an item of single purpose etching equipment, or may be a multiple purpose wafer processing system. One equipment particularly well suited for practicing the present invention is the Exelan™ system dry etch system, available from Lam Research Corporation, Fremont, Calif. Exelan™ is capable of performing hardmask open, inorganic and organic ARC etch, and photoresist strip in situ within a single chamber.

The wafer, previously having had a layer of patterned photoresist applied to let upper surface thereof, is mounted within the chamber, and an etch plasma struck. A flow of etchant gas is introduced into the chamber, 3. As previously discussed, this etchant gas comprises a mixture including argon, oxygen, difluoromethane, and octafluorocyclobutane.

The present invention may conveniently be implemented as part of a multi-step etch regime, for instance as shown at FIGS. 1 and 2. Having reference now to FIG. 2*a,* an example wafer, 1, having a patterned layer of photoresist, 10, is shown. In this example, wafer 1 includes a silicon substrate, 22 having deposited thereon a silicon carbide barrier layer, 20. Deposited over barrier layer 20 is a first layer 18 of organosilicate dielectric, for instance Coral™. A thin silicon carbide trench stop layer 16, is disposed between first blank layer 18, and a second blank layer, 14, also of Coral™ deposited over trench stop layer 16. A hard mask layer of PEARL™, a plasma-enhanced anti-reflective layer also available from Novellus Systems, Inc. San Jose, Calif. is deposited over second organosilicate layer 14, completing the example in wafer stack. Patterned photoresist layer 10, previously discussed, is applied over hard mask 12.

Figure 2A:
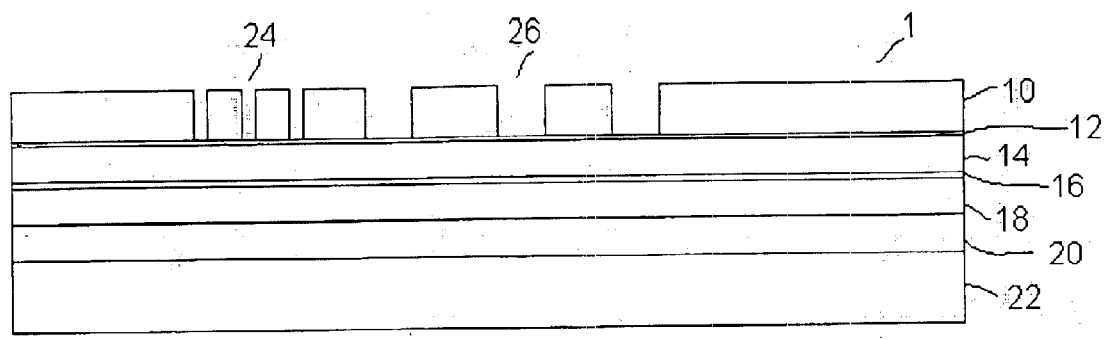
FIG. 2*a* is a cross section through an example wafer stack, including a layer of patterned photoresist, prior to etching according to one embodiment of the present invention.
Figure 2B:
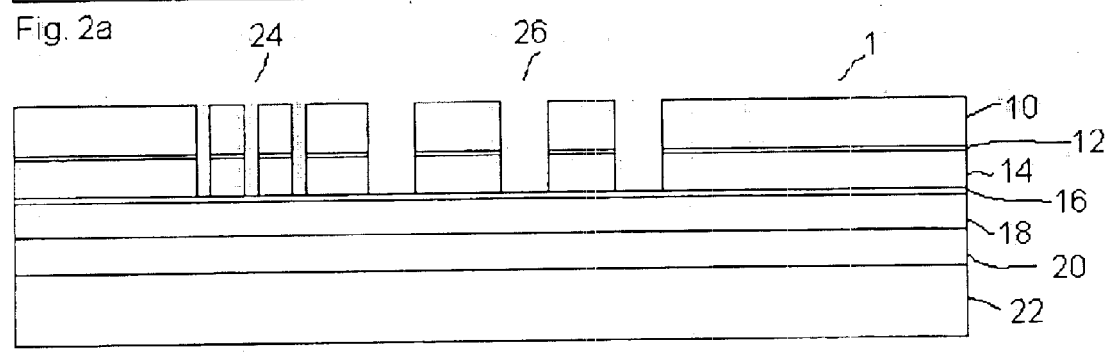
FIG. 2*b* is a cross section through the example wafer stack, after a first etch step performed in accordance with one embodiment of the present invention.

Referring now to FIG. 2*a* and having continued reference to FIG. 1*a,* the effect of step 3 of FIG. 1*a* the shown. At this point, the previously discussed etch step implementing the etch mixture including Ar, oxygen, difluoromethane, and (octafluorocyclobutane is performed utilizing the dual-frequency etch equipment previously discussed.

According to one embodiment of the present invention, a first, selective, etch step is conducted at a chamber pressure of between 0 and 250 mTorr, more preferably between 10 and 100 mTorr, more preferably still between 20 and 80 mTorr, and most preferably at about 60 mTorr. The upper frequency of the plasma is formed at power levels from about 250 W to about 2500 W. More preferably, the upper power level is formed from about 500 W to about 2000 W. More preferably still, this power level is set at between about 1000 to about 2000 W. Most preferably the upper frequency power is set at about 1500 W. The lower frequency power level is set at power levels from about 250 W to about 2500 W. More preferably, the upper power level is formed from about 500 W to about 2000 W. More preferably still, this power level is set at between about 1000 to about 2000 W. Most preferably the upper frequency power is set at about 1100 W.

The mixture of etchant gas is preferably comprised of flows of the constituent etch gasses. These include argon at flows from about 20 SCCM to about 300 SCCM, more preferably from about 50 SCCM to about 200 SCCM, more preferably still from about 100 SCCM to about 200 SCCM and most preferably at about 160 SCCM. The etchant gas also contains a flow of oxygen from about 1 SCCM to about 50 SCCM, more preferably from about 3 SCCM to about 30 SCCM, more preferably still from about 5 SCCM to about 20 SCCM and most preferably at about 10 SCCM.

The etchant further includes the flow of difluoromethane, CH2F2, previously discussed, from about 1 SCCM to about 50 SCCM, more preferably from about 3 SCCM to about 30 SCCM, more preferably still from about 5 SCCM to about 20 SCCM and most preferably at about 7 SCCM. Also included is a flow of octafluorocyclobutane, C4F8, also discussed previously and at a flow rate from about 1 SCCM to about 50 SCCM, more preferably from about 2 SCCM to about 30 SCCM, more preferably still from about 4 SCCM to about 20 SCCM and most preferably at about 5 SCCM. A final etch gas constituent in this embodiment is CF4, tetrafluormethane at a flow rate from about 1 SCCM to about 50 SCCM, more preferably from about 2 SCCM to about 30

SCCM, more preferably still from about 4 SCCM to about 20 SCCM and most preferably at about 5 SCCM.

Etching proceeds at a controlled temperature, for a specified period of time. In the exemplar under discussion, processing may proceed at temperatures between 0 C and 50 C. More particularly from about 5 C to about 40 C. More particularly still, from about 10 C to about 30 C, and most preferably at about 20 C. Process times may vary from small fractions of a second to about 10 minutes. In the example presented here, processed at the most preferable power settings, gas flows and temperature, processing was accomplished in about 75 seconds. This etch step provides a high degree of selectivity between the organosilicate dielectric 14 and the stop layer 16.

In order to accomplish the preceding temperature control, the temperature of the wafer is thermally maintained by a flow of coolant gas through the chuck retaining the wafer in the reaction vessel. This flow of coolant gas, for instance helium, is at a flow rate from about 1 SCCM to about 50 SCCM, more preferably from about 2 SCCM to about 30 SCCM, more preferably still from about 10 SCCM to about 20 SCCM and most preferably at about 15 SCCM.

At this point in the etch regime, the features, for instance 24 and 26, defined by photoresist layer 10 have now been etch through the first line layer, 14, and etching has stopped at the trench stop layer 16. In order to etch through trench, or etch stop layer 16, a second etch step, 4, is now performed.

According to the embodiment of the present invention, a second, low selectivity etch step is conducted at a chamber pressure of between 0 and 250 mTorr, more preferably between 10 and 100 mTorr, more preferably still between 20 and 80 mTorr, and most preferably at about 70 mTorr. This etch step provides a low degree of selectivity between the organosilicate dielectric and the SiC stop layer.

To perform this step, the upper frequency of the plasma is formed at power levels from about 250 W to about 2500 W. More preferably, the upper power level is formed from about 500 W to about 2000 W. More preferably still, this power level is set at between about 1000 to about 2000 W. Most preferably the upper frequency power is set at about 1500 W. The lower frequency power level is set at power levels from about 50 W to about 1500 W. More preferably, the lower frequency power level is formed from about 100 W to about 1500 W. More preferably still, this power level is set at between about 250 to about 1000 W. Most preferably the lower frequency power is set at about 500 W. This etch step provides a low degree of selectivity between the organosilicate dielectric 14 and the stop layer 16.

Figure 2C:
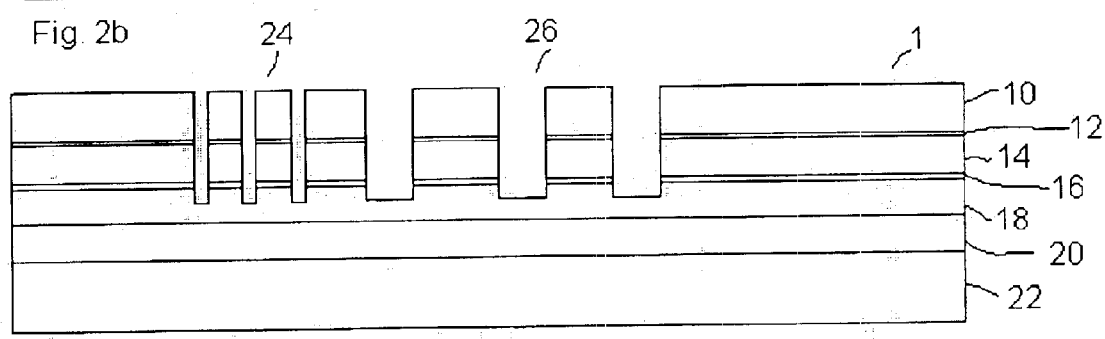
FIG. 2*c* is a cross section through the example wafer stack, after a second etch step performed in accordance with one embodiment of the present invention.
Figure 2D:
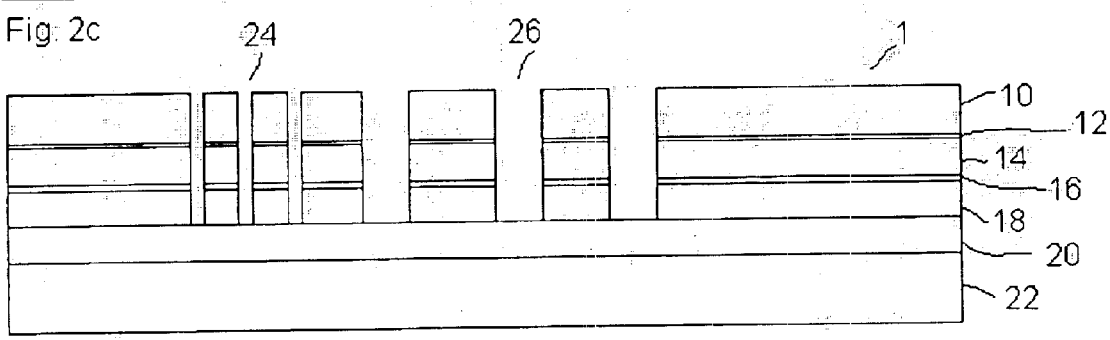
FIG. 2*d* is a cross section through the example wafer stack, after a third etch step performed in accordance with one embodiment of the present invention.
Figure 2E:
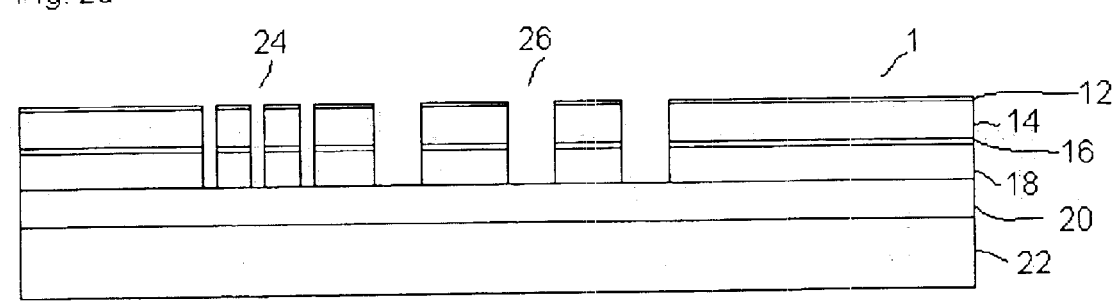
FIG. 2*e* is a cross section through the example wafer stack, after all etching has performed in accordance with one embodiment of the present invention, and following in situ stripping of the photoresist layer.

When the etch stop layer has been etched through, as shown at FIG. 2c, a third, selective etch step is performed, as shown at 5. According to the example wafer stack discussed herein, where the composition and thickness of second organosilicate dielectric layer 14 and first organosilicate dielectric layer 18 are substantially identical, this third etch step is likewise substantially identical to the first etch step. Process time may vary slightly between the first and third etch steps depending on the amount of the second organosilicate dielectric layer which has been previously etched during step 4. Etch step 5 is completed when barrier 20 is reached, as shown at FIG. 2d. Again, this etch step provides a high degree of selectivity between the organosilicate dielectric 18 and the stop layer 16.

A further alternative embodiment of the present invention contemplates the in situ stripping of the photoresist mask, 10. This embodiment is shown at FIG. 1b. Following the third etch step, 5, photoresist mask 10 is stripped as follows:

According to this embodiment of the present invention, an in situ photoresist strip step, 7, is conducted at a chamber pressure of between 10 and 1000 mTorr, more preferably still between 100 and 500 mTorr, and most preferably at about 330 mTorr. The upper frequency of the strip plasma is formed at power levels from about 25 W to about 1000 W. More preferably, the upper power level is formed from about 100 W to about 500 W. Most preferably the upper frequency power is set at about 200 W. The lower frequency power level is set at power levels from about 0 W to about 500 W. More preferably, the upper power level is formed from about 50 W to about 250 W. Most preferably the upper frequency power is set at about 100 W.

The mixture of stripping gas is preferably comprised of flows of the constituent strip gasses. These include oxygen at flows from about 10 SCCM to about 2000 SCCM, more preferably from about 100 SCCM to about 2000 SCCM, more preferably still from about 500 SCCM to about 1500 SCCM and most preferably at about 1000 SCCM. The etchant gas also contains a flow of nitrogen from about 1 SCCM to about 500 SCCM, more preferably from about 50 SCCM to about 300 SCCM, more preferably still from about 75 SCCM to about 250 SCCM and most preferably at about 200 SCCM.

Stripping also proceeds at a controlled temperature, for a specified period of time. In the exemplar under discussion, stripping may proceed at temperatures between 0 C and 50 C. More particularly from about 5 C to about 40 C. More particularly still, from about 10 C to about 30 C and most preferably at about 15 C. Process times may vary from small fractions of a second to about 10 minutes. In the example presented here, processed at the most preferable power settings, gas flows and temperature, processing was accomplished in about 40 seconds. This etch step provides a high degree of selectivity between second organosilicate dielectric 14 and stop layer 16.

At this point, the previously discussed etching and stripping steps have been completed, features 24 and 26 formed in wafer stack 1, and photoresist layer 10 stripped from that wafer stack. The wafer stack is now ready for further patterning, doping or deposition steps as required to complete the integrated circuit device.

A specific feature of the present invention is its novel ability to form features of widely varying size contemporaneously, with excellent profile control and with minimal RIE lag, minimal bowing of the vias formed by the etch process, good etch profiles, good resist selectivity, and good etch uniformity across the wafer.

It will be apparent to those having ordinary skill in the art that the previously discussed power levels, pressures, flow rates, and temperatures are by way of example only. Different blank dialectic materials disposed at varying thicknesses in the wafer stack may require different combinations of power, pressure, flow, and temperature. The principles in the present invention specifically contemplate all such combinations.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the principles of the present invention specifically contemplate the incorporation of one or more of the various features and advantages taught herein on a wide variety of integrated circuit devices formed of varying wafer stack configurations defined by a number of different layers. The previously discussed process variables are of course capable of modification by those having skill in the art to effect different integrated circuit devices. Each of these alternatives is specifically contemplated by the principles of the present invention.

What is claimed is:

1. A method for etching a feature in an integrated circuit wafer incorporating at least one layer of organosilicate glass dielectric over an etch stop layer, the method comprising:

positioning the wafer in a reaction chamber;

introducing a flow of etchant gas mixture including C4F8, CH2F2, oxygen, and CF4 into the reaction chamber;

striking a plasma with the etchant gas in the reaction chamber; and selectively etching the at least one layer of organosilicate glass with the plasma from the etchant gas with respect to the etch stop layer.

2. The method, as recited in claim 1, wherein the etchant gas mixture further comprises argon.

3. The method, as recited in claim 2, wherein the at least one layer of organosilicate glass is a first layer of organosilicate glass dielectric, which is etched with the plasma from the etchant gas comprising C4F8, CF4, CH2F2, oxygen and argon.

4. The method, as recited in claim 3, further comprising stopping the flow of CH2F2 and C4F8 in the etchant gas and using the resulting plasma to etch through an etch stop layer.

5. The method, as recited in claim 4, further comprising stripping a photoresist mask above the layer of organosilcate glass, wherein the photoresist mask is used to pattern the layer of organosilicate glass, comprising:

stopping the flow of C4F8 and CF4 into the reaction chamber, after etching through the etch stop layer;

providing a flow of nitrogen into the reaction chamber; and generating a plasma in the reaction chamber.

6. A method for etching a feature in a first layer of organosilicate glass layer over a silicon carbide etch stop layer, the method comprising:

positioning the wafer in a reaction chamber;

selectively etching through the first layer of organosilicate glass dielectric with respect to the silicon carbide etch stop layer, comprising:

providing a flow of an etchant gas mixture including C4F8, CH2F2, oxygen, and CF4 into the reaction chamber; and generating a plasma with the etchant gas in the reaction chamber.

7. The method, as recited in claim 6, wherein the etchant gas mixture for etching through the first layer of organosilicate glass, further comprises argon.

8. The method, as recited in claim 7, further comprising etching through the silicon carbide etch stop layer, comprising:

providing an etchant gas mixture without C4F8 and CH2F2 into the reaction chamber; and generating a plasma with the etchant gas in the reaction chamber.

9. The method, as recited in claim 7, further comprising etching through an etch stop layer after etching through the first layer of organosilicate glass, comprising:

stopping the flow of C4F8 and CH2F2 into the reaction chamber; and generating a plasma with the etchant gas in the reaction chamber.

10. The method, as recited in claim 9, further comprising etching through a second layer of organosilicate glass dielectric, comprising:

restarting the flow of C4F8 and CH2F2 into the reaction chamber; and generating a plasma with the etchant gas in the reaction chamber.

11. The method, as recited in claim 10, further comprising stripping a photoresist mask above the layer of organosilicate glass, wherein the photoresist mask is used to pattern the layer of organosilicate glass, comprising:

stopping the flow of C4F8 and CF4 into the reaction chamber, after etching through the second layer of organosilicate glass;

providing a flow of nitrogen into the reaction chamber; and generating a plasma with the etchant gas in the reaction chamber.

12. The method, as recited in claim 9, further comprising stripping a photoresist mask above the layer of organosilicate glass, wherein the photoresist mask is used to pattern the layer of organosilicate glass, comprising:

stopping the flow of C4F8 and CF4 into the reaction chamber, after etching through the etch stop layer;

providing a flow of nitrogen into the reaction chamber; and generating a plasma in the reaction chamber.

* * * * *